United States Patent
Fu et al.

(10) Patent No.: US 6,763,339 B2
(45) Date of Patent: Jul. 13, 2004

(54) BIOLOGICALLY-BASED SIGNAL PROCESSING SYSTEM APPLIED TO NOISE REMOVAL FOR SIGNAL EXTRACTION

(75) Inventors: Chi Yung Fu, San Francisco, CA (US); Loren I. Petrich, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 517 days.

(21) Appl. No.: 09/888,965

(22) Filed: Jun. 25, 2001

(65) Prior Publication Data

US 2002/0023066 A1 Feb. 21, 2002

Related U.S. Application Data

(60) Provisional application No. 60/214,063, filed on Jun. 26, 2000.

(51) Int. Cl.[7] .................................................. G06N 3/02
(52) U.S. Cl. .............................. 706/22; 706/15; 706/16; 704/205
(58) Field of Search .............................. 706/22, 15, 16; 342/90; 382/240, 228; 704/205

(56) References Cited

U.S. PATENT DOCUMENTS

| | | | |
|---|---|---|---|
| 5,388,182 A | * | 2/1995 | Benedetto et al. .......... 704/205 |
| 5,561,431 A | * | 10/1996 | Peele et al. .................... 342/90 |
| 5,598,481 A | | 1/1997 | Nishikawa et al. ......... 382/130 |
| 5,619,998 A | | 4/1997 | Abdel-Malek et al. . 128/660.07 |
| 5,673,332 A | | 9/1997 | Nishikawa et al. ......... 382/128 |
| 5,785,653 A | | 7/1998 | Kiyuna et al. ............... 600/408 |
| 6,182,018 B1 | | 1/2001 | Tran et al. .................... 702/66 |
| 6,208,951 B1 | | 3/2001 | Kumar et al. ............... 702/191 |
| 6,421,467 B1 | * | 7/2002 | Mitra .......................... 382/240 |
| 6,650,779 B2 | * | 11/2003 | Vachtesvanos et al. ..... 382/228 |

* cited by examiner

Primary Examiner—Wilbert L. Starks, Jr.
(74) Attorney, Agent, or Firm—Ann M. Lee; Alan H. Thompson; Eddie E. Scott

(57) ABSTRACT

The method and system described herein use a biologically-based signal processing system for noise removal for signal extraction. A wavelet transform may be used in conjunction with a neural network to imitate a biological system. The neural network may be trained using ideal data derived from physical principles or noiseless signals to determine to remove noise from the signal.

20 Claims, 1 Drawing Sheet

BIOLOGICALLY-BASED SIGNAL PROCESSING SYSTEM APPLIED TO NOISE REMOVAL FOR SIGNAL EXTRACTION

RELATED APPLICATION

This application relates to U.S. Provisional Application No. 60/214,063 filed Jun. 26, 2000, and claims priority thereof.

The United States Government has rights in this invention pursuant to Contract No. W-7405-ENG-48 between the United States Department of Energy and the University of California for the operation of Lawrence Livermore National Laboratory.

FIELD OF THE INVENTION

The present invention relates to signal processing, and more particularly, to extracting signals from noisy data.

BACKGROUND OF THE INVENTION

Much research effort has been expended on sensors and instrumentation such as those built with the latest Micro-Electro-Mechanical (MEMs) technology. However, intelligent signal processing, such as advanced signal and pattern recognition algorithms, has not been rigorously pursued. It is important to note that with intelligent processing, information from sensors may be made easier to interpret, transmit, conceal, and store, than if it was a large amount of raw data. Sensors or instrumentation deployed in real-world settings usually produce signals corrupted by various types of noise. As a result, noise removal is a prerequisite for accurate data interpretation analysis and effective storage/transmission. Noisy data would make data compression much harder and thus affect the issues of storage and transmission. Typical techniques such as the Fast Fourier Transform (FFT) have demonstrated limited capability when the noise amplitude is large and/or strongly overlapping of the signal's frequency spectrum. More advanced techniques include wavelets. Wavelets split a signal into overlapping subbands. Wavelets show promise for their ability to handle simultaneous localization of frequency and position, and thus offer more flexibility than the FFT because truncating certain transform coefficients has more a local effect than a global effect as in the case of FFT processing; but even there, if the signal-to-noise ratio is extremely large, even wavelet technology will fail.

SUMMARY OF THE INVENTION

Aspects of the present invention include a method comprising: receiving a signal corrupted with noise; decomposing the signal using a wavelet transform; re-synthesizing the decomposed signal; and inputting the re-synthesized signal into a neutral network to filter out the noise from the signal and recover an uncorrupted signal.

Aspects of the present invention further include a system comprising: a wavelet transformer capable of decomposing a signal and re-synthesizing the signal to eliminate the high frequency noise and most of the low frequency interference; and a neural network operatively coupled to said wave transformer and capable of filtering out noise from the signal and outputting an uncorrupted signal.

BRIEF DESCRIPTION OF THE DRAWINGS

The accompanying drawing, which is incorporated into and forms a part of the disclosure.

DETAILED DESCRIPTION OF THE INVENTION

Figure 1:
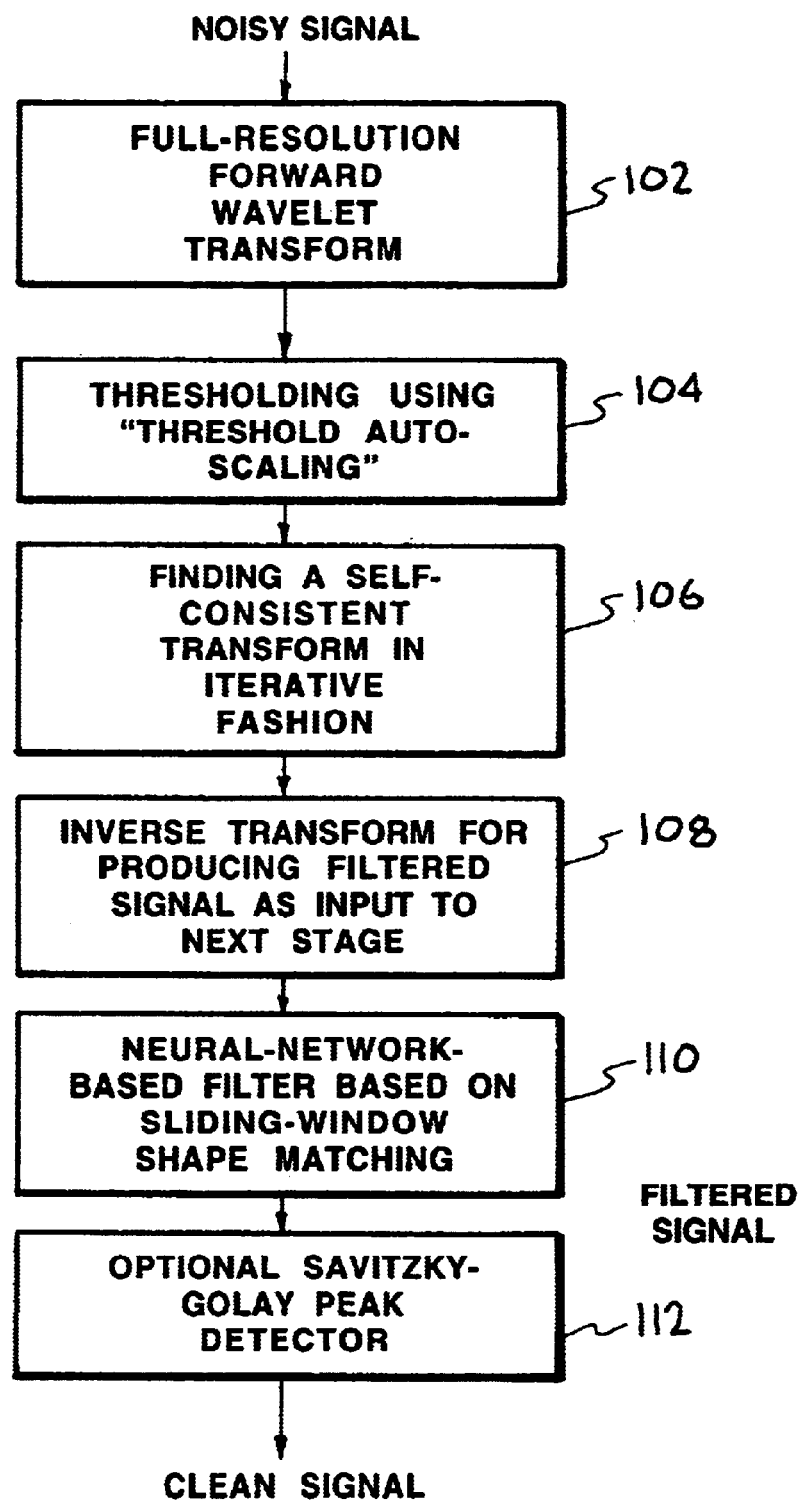
FIG. 1 is a functional block diagram showing a method and system for extracting signals from noisy data.

The human being and various biological species have demonstrated amazing ability to extract signals from noisy data. The method and system described herein are based on this biological fact. For almost all sensors and equipment, typically there is an understanding of the shape of the ideal signal since the shape of the signal is known either from physical principals or may be obtained in a control environment such as a laboratory and thus noise may be eliminated or reduced to a minimum. This high order information, for example, the shape of the ideal signal, is typically ignored when FFT's and wavelet technologies are deployed. However, such knowledge provides enormous advantages to human beings when dealing with data extraction and interpretation since they know what they are looking for. Once you know what you are looking for, then the problem becomes more "solvable." Taking a cue from this information-constrained signal-extraction capability, the method and system disclosed herein makes use of this unique property. Artificial neural networks are good tools for such an implementation. In the case of noise removal, the shape of the noiseless signals, derived either from physical principles or obtained in a controlled environment without noise interference, may then be used in supervised learning to constrain the system's behavior when it is corrupted by noise. Shape is not the only possible piece of usable information, other high-level information may also be effectively used to constrain the system. As another example, if the problem is symmetrical then there is a need to only solve half the problem. The method and system described herein use "high order" information for constraining the system so as to more effectively extract relevant information such as noise removal.

Biological systems are typically multistage; for example, our visual system employs the retina both as a sensor array and as a preprocessor before information is transmitted through the optic nerve bundle to the brain for neural processing. It is doubtful that FFT-like signal processing is advantageous for such biological preprocessing, simply because FFT's trade positional accuracy for frequency resolution. If FFT's are used as biological preprocessors, there could be a question about our ability to locate specific objects; thus some type of approach that does not sacrifice positional accuracy or localization, such as wavelets or wavelet-like technologies, could have been used for such biological pre-processing. As a result, part of the method and system disclosed herein is to include such technologies, an example of which is the wavelet technique, for signal processing.

In the modeling of the biological world, such as in the case of the olfactory system, it turns out that not only does the olfactory bulb transmit information to the brain for processing, but it also receives information from the brain, and thus the olfactory bulb and the brain are coupled in such models. This implies that the wavelet technologies and the neural-network techniques have to be carefully chosen so that they may work synergistically. In the method and system described herein, there is demonstrated an effective coupling between a wavelet and a neural network technology. The method and system described herein also include a postprocessing filter to precisely locate the positions of the desired signals (peaks) and at the same time to reject false signals produced by remaining noise.

The method and system described herein may be used in an exemplary embodiment to extract clean signals from noisy gas-chromatography (GC) data. For the purpose of supervising training, noisy data may be generated from the ideal data by corrupting it with various amounts of white noise whose amplitude may be as high as the signal itself. As a result, the noisy data become the inputs and clean data become the desired outputs for training in such an adaptive system as the case of an artificial neural network. As previously indicated, clean signals may also be obtained under ideal laboratory settings and thus the exact mathematical formulations to describe the clean signals are not needed or required. Data corrupted with white noise may be chosen because its power spectrum tends to overlap the signals' spectrum, thus making signal extraction potentially difficult. Though data corrupted with white noise has been chosen for training, because of the generalization capability of neural networks, it has been found that the method and system is equally effective to other type of noise such as Gaussian noise.

As illustrated by FIG. 1, in the method and system described herein the incoming noisy (or corrupted) signal may first be acted upon in a preprocessing steps 102, 104, 106 and 108, followed by analysis in a processing step 110 and optionally filtered in a postprocessing step 112. In full-resolution forward wavelet transformation step 102, much of the incoming signal noise is removed without sacrificing the positional accuracy of the signal peaks. Wavelets may be selected because they are capable of resolution in both frequency and time, and not just frequency alone. Thus, changes made to the incoming noisy signal would be relatively localized. If a coefficient was clipped because of thresholding (i.e., the operation of setting values below a given value to zero to suppress noise), the effects of that clipping would thus be localized and not spread over the whole signal, as would happen with FFT's. Also, there is an advantage over a low-pass filter in that high-frequency signals, which would have been truncated completely using a low-pass filter, will be kept in the wavelet processing if they are strong enough; this is desirable for preserving important fine details, such as the edges of objects. Such preprocessing essentially keeps the desired data intact but with the noise sufficiently cleaned up. In other words, using the preprocessed signal, which had had most of the noise-induced artifacts removed, the neural network which may be utilized in step 110 is less likely to be "confused" and thus may have a simpler design, something desirable because of its simpler hardware and lower cost. Though wavelets are capable of achieving such a preprocessing purpose, the use of other techniques should not be precluded such as the use of another neural network in the preprocessing stage.

In the wavelet based transform step 102, the incoming noisy signal is transformed into the wavelet domain at full resolution instead of doing decimation with each new level of resolution so to achieve best possible positional accuracy. This is because decimation is keeping every second value with each higher level, which translates into every second, every fourth, every eighth, every sixteenth, etc. as one goes up the levels. However, full resolution does produce some redundancy, but this redundancy may be exploited in later processing, as explained below.

For processing simplicity, the thresholding step 104 may be implemented with two values: a threshold value at the lowest level and a multiplier for finding each level's threshold from the previous one. This multiplicative approach may be used because wavelet transforms may introduce multiplicative factors into the results for each new level and thus the method and system described herein may take correct for this. In addition, the user does not have to specify the threshold individually for each level of decomposition, thus "threshold autoscaling" for each level, making the setup of the system simpler. The spirit of the method and system described herein is not violated if different means are used to create these threshold values or that the values are set manually.

If the transform is undone after doing simple thresholding in step 104, there may be awkward artifacts resulting from how the transformed value drops from just above threshold to zero. However, a solution to that may be to find the values of the below-threshold areas that produce a self-consistent transform result in step 106. This is likely to smooth out the transitions between below-threshold and above-threshold areas, thus reducing artifacts. What is meant by a self-consistent transform result is a result in which undoing, then redoing the wavelet transform will yield that transform result again. Finding such a result may be done iteratively, with various techniques; the redundancy in the transform makes it likely that the process will converge to a good approximation of the desired solution.

In step 108, an inverse transform is performed for producing a filtered signal as an input to the next step 110.

U.S. Pat. No. 6,182,018 to Tran et al., issued Jan. 30, 2001, and hereby incorporated by reference also teaches the use of a wavelet transform (and a neural network). However, Tran et al. disclose the use various statistical calculations for either including or excluding an entire set of coefficients for each of the transformed levels after performing a wavelet transformation, which is not required by the method and system described herein. The method and system described herein each wavelet coefficient may be evaluated separately, and it may either be rejected or retained independent of other coefficients from the same level. As a result, within each set of wavelet coefficients for each level, some of the wavelet coefficients may be rejected and some may be retained. Thus, not only are the selection criteria different, since the selection criteria may not be used, but more importantly, each coefficient within each set of wavelet coefficients is treated independently. In contrast, in Tran et al. the entire set of coefficients is treated as a block to be included or excluded. Furthermore, the threshold values that may be used in the method and system described herein may be adaptively adjusted from layer to layer with a global threshold value and a multiplier supplied by the users.

As previously discussed, the preprocessing steps 102, 104, 106 and 108 and the processing step 110 may be tightly coupled. The typical example for the processing step 110 may be a projection neural network. An example of a specific network that would serve the purpose is the Logicon Projection network as disclosed in U.S. Pat. No. 5,276,771 to Wilensky et al., issued Jan. 4, 1997 and hereby incorporated by reference. Such a network has the advantage of system efficiency by more effectively using each neuron and thus resulting in a very compact system with very few neurons. A purpose of this step is to have an intelligent system such as neural networks to learn the high order information such as the ideal shape of the desired signal to constrain the system and thus effectively removal the remaining noise through supervised learning. Other intelligent algorithm than may serve similar purpose may also be used.

Tran et al. also disclose a neural network. However, the neural network of Tran et al. is disclosed to be classifier. The neural network used in step 110 instead of functioning as classifier may function as a filter for the purpose of rejecting noise. In step 110, using the knowledge of the expected shape of the signals, the neural network may be trained to recover the signal even when it has been corrupted by noise.

Finally, after passing through the processing step 110, the data is optionally fed into the final postprocessing filter in step 112. The Savitzky-Golay filters may be used for finding first and second derivatives. Such a filter may not only provides precise location of the GC peaks; it also may reject low-frequency interference and small false peaks caused by residual noise through appropriate selection of filter footprint and thresholding criteria which is different from that used in wavelet preprocessing. The output of the postprocessing filter in step 112 is a substantially clean signal.

For the purpose of training the neural network, a set of training data may be used with approximately 99,000 data points consisting of 360 different peaks with the following parameters:

Peak Heights: 0.3, 0.6, 1
Peak Gaussian widths: 8, 16
Peak exponential-decay lengths: 0, 16, 32, 48, 64
Noise has amplitude 0, 0.15, and 0.3, in absolute units.

As such, the training dataset may have relative noise amplitudes ranging from 0 to 100%. To test the method and system described herein in unanticipated scenarios, "unseen" data that have not been used for training may be used for furthering testing of the method and system described herein. These data were generated with the following parameters:

Peak heights: 0.15, 0.45, 0.8
Peak Gaussian width: 12
Peak exponential-decay lengths: 8, 24, 40, 56
Noise has amplitudes 0.1 and 0.25 relative to the peak heights; for example, a peak with height 0.45 would get error amplitudes of 0.045 and 0.1125 in absolute units. Evaluation of system performances may be accomplished by finding the number of false peak detection and the root mean square (RMS) error of those peaks detected when compared with the ideal ones.

These results may be obtained with variants of the Savitzky-Golay peak detector. One of these uses a filter width factor or footprint of 7 and a relative curvature threshold of 0.01 (old filter), and the other of these used a filter width factor of 31 and a relative of 0.3 (new filter). The actual number of points sampled by the filters is (2*(width factor)+1), or 15 for the old filter and 63 for the new filter. The higher the number of samples, the smoother will be the result at the expense of correct detection the peak heights. The relative curvature threshold is for setting a curvature-value (second-derivative) threshold for acceptance that is some fraction of the maximum curvature value for the dataset. Practical applications, however, may need some other way of setting this threshold. Too low a setting will result in "detection" of peaks that are not present (false positives) and too high a setting will lead to failure to detect peaks that are present (false negatives).

Two types of neural networks are illustrated here—the standard backpropagation network (old neural network) and the Logicon Project network (neural network).

The Logicon Projection neural network does better than the standard backpropagation one, and the more inputs the neural network receives, the better the performance, through at the expense of hardware complexity. The Savitzky-Golay filter, with its larger footprint, outperforms the old one, with its smaller footprint, and thus the new peak detector has fewer false results than the old one. Based on wavelet preprocessing, the best test results using a Logicon Projection network with 63 inputs and a large footprint postprocessing filter has no false peaks for 10% and 25% noise in the "unseen" test set, and only 6 false peaks out of the possible 360 true peaks in the training set which has relative noise amplitude as high as 100%. Also the system is sufficiently generalized so it is equally effective against white and Gaussian noise in the case of test data, even though the system had only been trained with the noise all being white noise.

In an alternative embodiment, the wavelet preprocessing may be replaced by another neural network, and thus the preprocessing neural network with the processing one, thus a yielding a simpler system. Also, in another alternative embodiment, instead of one-dimensional settings, it may be expanded to two dimensions for processing images and three dimensions for handling videos. In addition to noise removal, such a signal processing technique may assist identifying interesting features or targets in a spectrum, an image and other multi-dimensional objects. The technology may be repetitively employed or parallel deployed to assist in identifying multiple features which may be used to find higher-level conclusions.

Besides applying the method and system described herein for analytical-extraction such as that of gas chromatography, they also may be applied to medical instrument signal processing, such as echocardiograms. Instruments that measure returned signals, such as those used in seismology, may have their outputs processed by the method and system described herein, particularly for the purpose of treaty verification as well as for oil exploration.

The foregoing is illustrative of the present invention and is not to be construed as limiting thereof. The invention is defined by the following claims, with equivalents of the claims to be included therein

What is claimed is:

1. A method comprising:
    receiving a signal corrupted with noise;
    decomposing said signal using a wavelet transform;
    modifying wavelet coefficients of said wavelet tranform to reject noise;
    re-synthesizing said decomposed signal; and
    inputting said re-synthesized signal into a neutral network to further filter out the noise from the signal and recover a clean signal.

2. A method comprising:
    receiving a signal corrupted with noise;
    decomposing said signal using a wavelet transform to produce a plurality of wavelet coefficients;
    evaluating each of said plurality of wavelet coefficients separately and determining acceptance of each of the plurality of wavelet coefficients independently;
    re-synthesizing said signal using an inverse transform; and
    inputting said decomposed signal into a neutral network to recover a clean signal.

3. A method comprising:
    receiving a signal corrupted with noise;
    transforming said signal into the wavelet domain at substantially full resolution;
    thresholding said signal;
    iteratively determining a self-consistent transform of said signal to act as a filter;
    recover said signal using an inverse transform; and inputting said signal into a neutral network to further recover a clean signal.

4. The method of claim 3, wherein said thresholding step may be implemented with at least two values.

5. The method of claim 4, wherein said at least two values include a threshold value at a lowest level and a multiplier for finding a level's threshold from the previous level.

6. The method of claim 3, wherein said thresholding step uses threshold autoscaling for each threshold level.

7. The method of claim 3, wherein said neural network is a projection neural network.

8. The method of claim 3, further comprising:

a Savitzky-Golay filter may filter the signal after processing by the neural network and identify first and second derivatives for further processing.

9. The method of claim 3, further comprising:

training said neural network using a set of data to enable the neural network to recognize signals.

10. The method of claim 9, wherein said training data may include noiseless signal data or ideal data derived from physical principles.

11. A system comprising:

a wavelet transformer capable of decomposing a signal; and a neural network operatively coupled to said wave transformer and together capable of filtering out noise from the signal and outputting a clean signal.

12. The system of claim 11, wherein said neural network has been trained using noiseless signal data or ideal data derived from physical principle and such trained neural network after sufficient training will generalize its capability to recover signal from unseen corrupted data.

13. The system of claim 11, wherein said wavelet transformer is capable of producing a plurality of wavelet coefficients and evaluating each of said wavelet coefficients separately and determining acceptance of each of the plurality of wavelet coefficients independently.

14. The system of claim 11, wherein said neural network does not function as a classifier.

15. A system comprising:

a wavelet transformer capable of transforming a first signal into the wavelet domain, thresholding said first signal, finding a self-consistent transform of said first signal through a plurality of iterations, and producing a filtered signal from said first signal through an inverse transform; and a neural network capable of processing said filtered signal to obtain a clean signal.

16. The system of claim 15, wherein said wavelet transformer is capable of producing a plurality of wavelet coefficients in the wavelet domain and evaluating each of said wavelet coefficients separately and determining acceptance of each of the plurality of wavelet coefficients independently.

17. The system of claim 15, wherein said neural network functions as filter.

18. The system of claim 15, further comprising:

a Savitzky-Golay filter operatively coupled to said neural network.

19. A system comprising:

a means for decomposing a signal using a wavelet transform;

a means to modify wavelet coefficients of said wavelet transform to remove noise;

a means for re-synthesizing said decomposed signal; and a means for inputting said re-synthesized signal into a neutral network to filter out the noise from the signal and recover a clean signal.

20. A system comprising:

a means for receiving a signal corrupted with noise;

a means for decomposing said signal using a wavelet transform to produce a plurality of wavelet coefficients;

a means for evaluating each of said plurality of wavelet coefficients separately and determining acceptance of each of the plurality of wavelet coefficients independently;

a means for re-synthesizing said signal using an inverse transform; and a means for inputting said decomposed signal into a neutral network to recover a clean signal.

* * * * *